(12) United States Patent
Bodo et al.

(10) Patent No.: US 8,975,787 B2
(45) Date of Patent: Mar. 10, 2015

(54) REDUCED PARTS COUNT ISOLATED AC CURRENT SWITCHING AND SENSING

(75) Inventors: Martin J. Bodo, Los Altos Hills, CA (US); Robert A. Rosenbloom, Santa Cruz, CA (US); Oleg Strelnikov, Volgograd (RU)

(73) Assignee: Computer Performance, Inc., Santa Clara, CA (US)

( * ) Notice: Subject to any disclaimer, the term of this patent is extended or adjusted under 35 U.S.C. 154(b) by 688 days.

(21) Appl. No.: 13/381,958

(22) PCT Filed: May 10, 2010

(86) PCT No.: PCT/US2010/001383
§ 371 (c)(1),
(2), (4) Date: Jan. 1, 2012

(87) PCT Pub. No.: WO2010/129071
PCT Pub. Date: Nov. 11, 2010

(65) Prior Publication Data
US 2012/0112728 A1    May 10, 2012

Related U.S. Application Data

(60) Provisional application No. 61/215,713, filed on May 8, 2009.

(51) Int. Cl.
| | |
|---|---|
| H01H 47/00 | (2006.01) |
| H01H 35/00 | (2006.01) |
| G01R 21/06 | (2006.01) |
| G01R 15/18 | (2006.01) |
| G01R 15/14 | (2006.01) |

(52) U.S. Cl.
CPC ............ *G01R 15/142* (2013.01); *G01R 21/06* (2013.01); *G01R 15/18* (2013.01)
USPC ........................................... 307/126

(58) Field of Classification Search
USPC ................................. 307/140, 126
See application file for complete search history.

(56) References Cited

U.S. PATENT DOCUMENTS

| | | |
|---|---|---|
| 3,758,763 A | 9/1973 | Nohara et al. |
| 4,077,061 A | 2/1978 | Johnston et al. |
| 4,182,983 A | 1/1980 | Heinrich et al. |
| 4,365,302 A | 12/1982 | Elms |
| 4,578,639 A | 3/1986 | Miller |
| 4,914,315 A * | 4/1990 | Nickolai ................. 307/137 |
| 4,965,755 A | 10/1990 | Patton et al. |
| 5,260,647 A | 11/1993 | Swerlein |
| 5,315,527 A | 5/1994 | Beckwith |

(Continued)

*Primary Examiner* — Rexford Barnie
*Assistant Examiner* — Dru Parries
(74) *Attorney, Agent, or Firm* — Donald E. Schreiber

(57) ABSTRACT

An appliance's control and sensing circuit selectively applies AC electrical power to a load (72). The circuit includes a relay (44) having contacts (52) connected in series between an AC power source and the load (72). When energized, the relay's electromagnetic coil (54) changes the contacts (52) to supplying electrical power to the load (72) or conversely. The control and sensing circuit measures AC voltage induced in the coil (54) by an alternating magnetic field produced by AC electrical current supplied to the load (72) through the relay's contacts (52). A microcontroller (46) included in the control and sensing circuit: 1. measures the AC voltage produced by the coil (54); 2. compensates the measured voltage for inductive coupling between the AC current flowing through the contacts (52) and the coil (54); and 3. determines various characteristics of the AC power supplied to the load (72).

34 Claims, 9 Drawing Sheets

(56) References Cited

U.S. PATENT DOCUMENTS

| | | |
|---|---|---|
| 5,457,595 A | 10/1995 | Baldwin |
| 5,528,134 A | 6/1996 | Davis et al. |
| 5,909,064 A * | 6/1999 | Feil et al. .................. 307/141 |
| 6,445,188 B1 | 9/2002 | Lutz et al. |
| 7,212,090 B2 | 5/2007 | Kadah |
| 2003/0111911 A1* | 6/2003 | Hsu .......................... 307/141 |

* cited by examiner

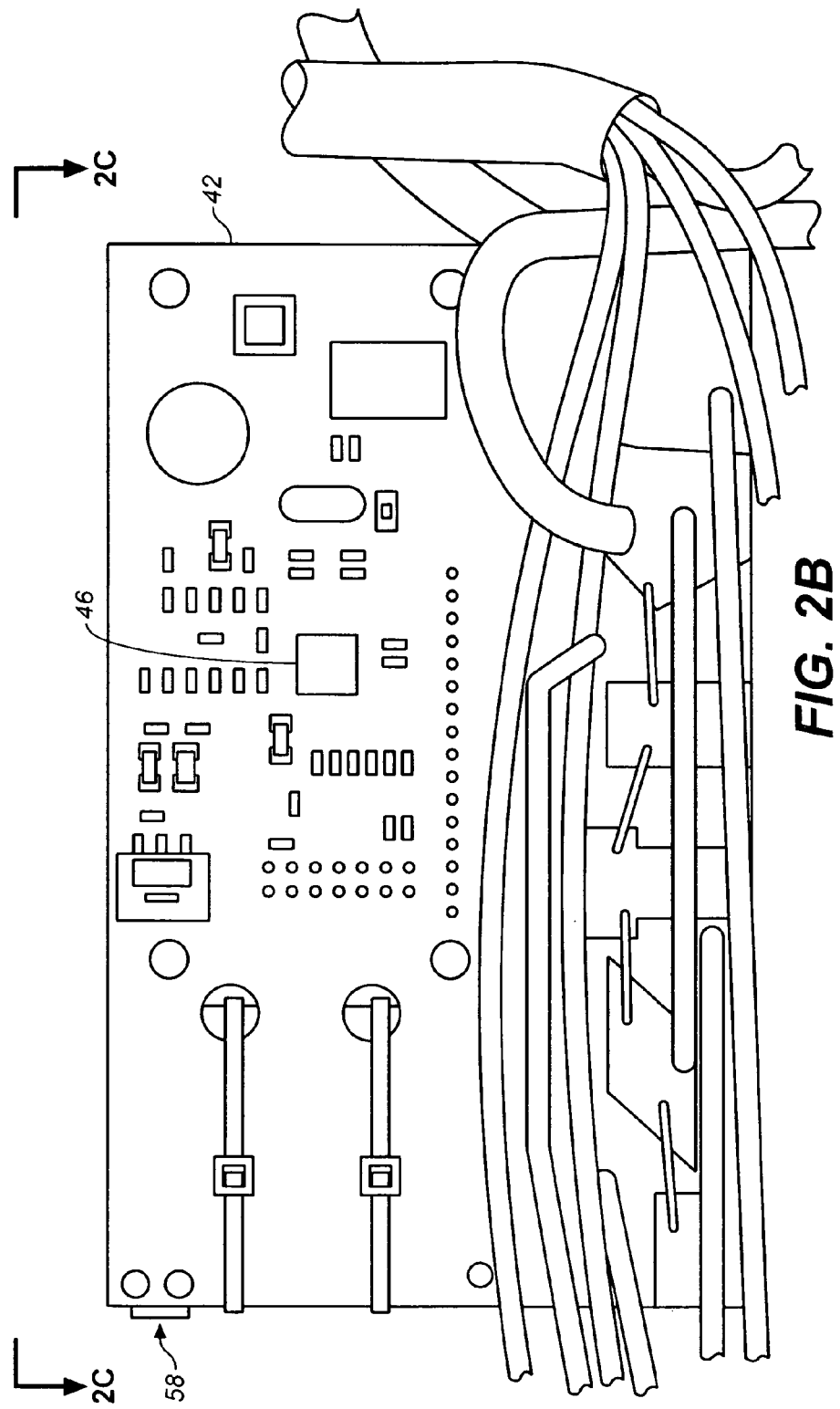

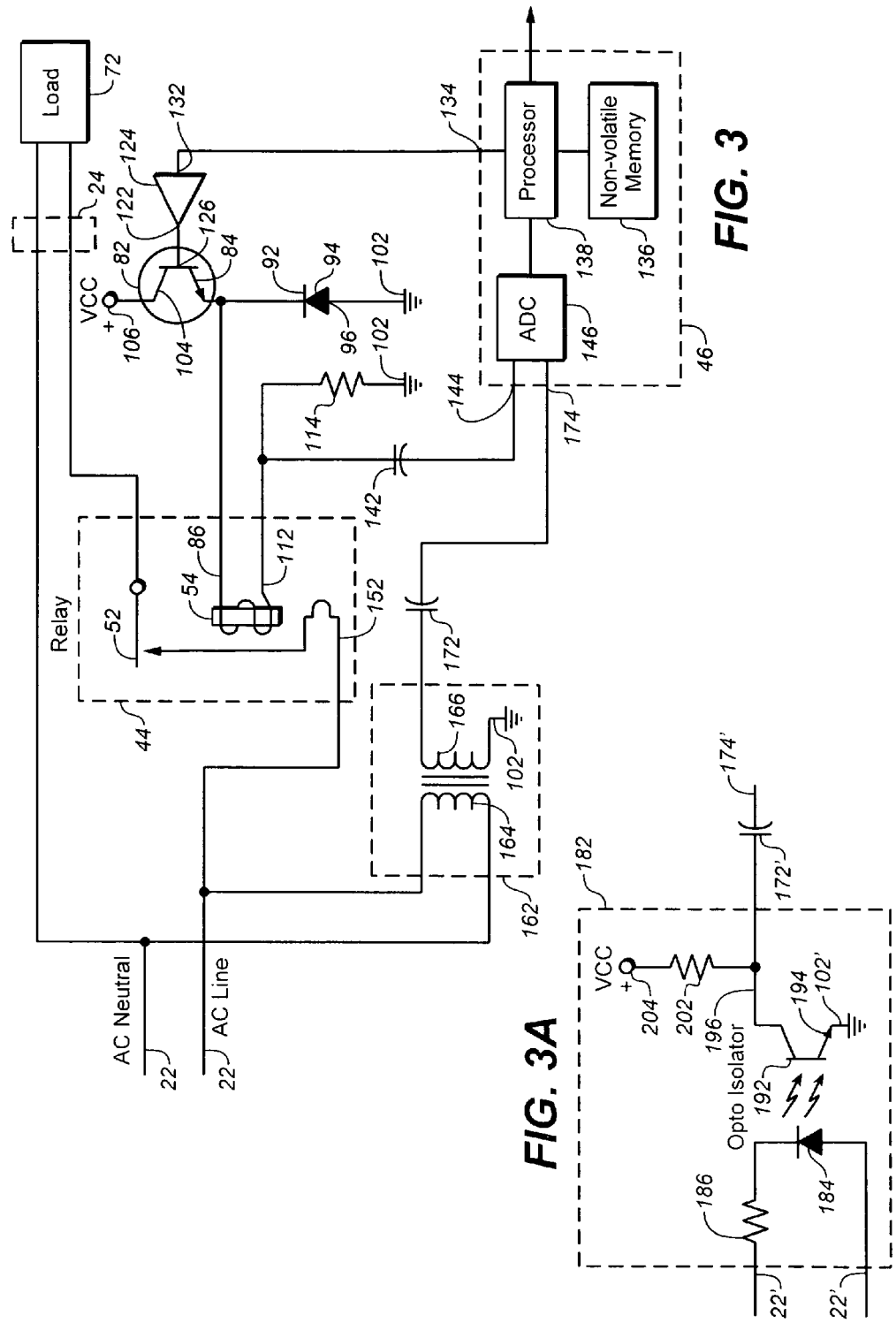

REDUCED PARTS COUNT ISOLATED AC CURRENT SWITCHING AND SENSING

This patent application claims priority under 35 U.S.C. §371 from Patent Cooperation Treaty ("PCT") International Patent Application PCT/US2010/001383 entitled "Reduced Parts Count Isolated AC Current Switching and Sensing" that was filed with the United States Patent and Trademark Office ("USPTO") on 10 May 2010, claiming the benefit of U.S. Provisional Patent Application Ser. No. 61/215,713 entitled "Reduced Parts Count Isolated AC Current Switching and Sensing Circuit" that was filed with the USPTO on 8 May 2009.

TECHNICAL FIELD

The present disclosure relates generally to controlling alternating current ("AC") flowing through a load, and more particularly an AC control circuit which also permits simultaneously sensing electrical current flowing through the load.

BACKGROUND ART

There exist numerous AC switching applications, such as power controllers, uninterruptable power supplies, and motor controls, that require:
1. switching an AC load on and off; and
2. that benefit significantly by simultaneously monitoring electrical current flowing through the AC load.

For most AC monitoring applications, the monitoring circuit must be electrically isolated from the AC power supplied to the load. Conventional electrically isolated AC monitoring circuits generally include either:
1. an optical isolator consisting of a photodiode combined with a LED connected in series with the AC power source and the load;
2. a current sensing transformer having a winding that is wired in series with the AC power source and the load;
3. a hall effect sensor that includes a magnetic field detector located nearby a high current conductor connected in series with the AC power source and the load; or
4. a high impedance differential amplifier which provides a high degree of virtual isolation through the use of large value series resistors connected to both sides of a resistive shunt connected in series with the AC power source and the load.

Processing a digitizing AC power signal to determine the phase of the AC power signal is well known. For example, U.S. Pat. No. 4,077,061 entitled "Digital Processing and Calculating AC Electric Energy Metering System" discloses a metering system for electric utility power line AC power measurements that digitizes randomly sampled AC voltage and current signals, and computes therefrom electric energy parameters. Similarly, U.S. Pat. No. 5,260,647 entitled "Measuring an AC Signal Value with Sampling When the Sampling Interval Does Not Exactly Divide the AC Signal's Period" discloses computer software that processes a digitally sampled AC waveform to accurately measure a sampled AC voltage. The disclosed computer software accurately measures a sampled AC voltage:
1. even though the available sampling intervals do not exactly divide the period of the AC signal to be measured; and
2. without averaging over a plurality of periods which is exactly divisible (or nearly so) by the sampling interval.

Also, U.S. Pat. No. 5,528,134 entitled "AC Power Analyzer" discloses computer software that performs spectrum analysis on the resampled points of an AC power waveform to reduce to zero artifacts at the harmonic intervals of the AC power frequency.

An electrically isolated relay circuit for switching AC power to a load on and off that also permits sensing electrical current flowing through the load while avoiding use of an optical isolator, a current sensing transformer or an operational amplifier with large value resistors would be economically advantageous. For many applications, an isolated AC switching and sensing circuit that requires fewer parts increases the practicality of sensing AC power, particularly for those applications in which the complexity or cost of a separate electrically isolated current sensor would otherwise be too expensive. The economic advantage of being able to sense electrical current flowing through a load while avoiding an additional optical isolator, transformer or operational amplifier increases even more if the current sensing components can be timeshared among several different loads.

DISCLOSURE

An object of the present disclosure is to provide an isolated AC current switching and sensing circuit that requires fewer electrical components.

Another object of the present disclosure is to provide an electrically isolated relay circuit for switching AC power to a load that also permits sensing AC electrical current flowing through the load while avoiding use of:
1. an optical isolator;
2. a current sensing transformer; or
3. an operational amplifier together with large value resistors.

Yet another object of the present invention is to increase the practicality of sensing AC current flowing through a load, particularly for those applications in which the complexity and/or cost of a separate electrically isolated current sensor would otherwise be prohibitive.

Another object of the present disclosure is to provide an isolated AC current switching and sensing circuit that is more compact.

Yet another object of the present invention is to provide an electrical appliance that senses AC electrical current flowing through the load while avoiding use of:
1. an optical isolator;
2. a current sensing transformer; or
3. an operational amplifier together with large value resistors.

Yet another object of the present invention an electrical appliance that timeshares sensing of AC electrical current flowing through several different loads while avoiding use of:
1. an optical isolator;
2. a current sensing transformer; or
3. an operational amplifier together with large value resistors.

Briefly, in one aspect disclosed herein is a control and sensing circuit for selectively supplying AC electrical power to a load. The disclosed control and sensing circuit includes a relay that has:
1. at least one set of contacts that are connectable in series between a source of AC electrical power and the load; and
2. an electromagnet that includes a coil of insulated wire which upon supplying an electrical current to the coil changes the set of contacts between:
   a. a closed state in which the load receives AC electrical power; and b. an open state in which the load does not receive AC electrical power.

The disclosed control and sensing circuit also includes a coil energizing switch connected in series with the coil and with a source of relay energizing electrical power. The coil energizing switch when in:
1. a first state does not supply electrical current to the coil; and
2. a second state supplies electrical current to the coil for changing the set of contacts between the open state and the closed state.

Lastly, the disclosed control and sensing circuit includes an AC voltage sensing circuit coupled to the coil for measuring an AC voltage induced in the coil by an alternating magnetic field resulting from AC electrical current flowing through the set of contacts and the load when the set of contacts are in the closed state in which the load receives AC electrical power from the AC power source.

Also disclosed is an electrical appliance whose operation is energized by AC electrical power. The electrical appliance includes:
1. a load that receives AC electrical power; and
2. the disclosed control and sensing circuit.

Finally, a method for selectively supplying AC electrical power to a load is also disclosed. The method includes the steps of supplying AC electrical current to the load through at least one set of relay contacts. The relay's set of contacts are connectable in series between a source of AC electrical power and the load, The relay also includes an electromagnet that has a coil of insulated wire which upon receiving an electrical current changes the set of contacts between:
1. a closed state in which the load receives AC electrical power; and
2. an open state in which the load does not receive AC electrical power.

The disclosed method also includes the step of supplying electrical current to the coil of the relay via a coil energizing switch connected in series with the coil and with a source of relay energizing electrical power. The coil energizing switch is operable to be in:
1. a first state in which the coil does not receive electrical current; and
2. a second state in which the coil receives electrical current for changing the set of contacts between the open state and the closed state.

Finally, the disclosed method includes the step of measuring an AC voltage induced in the coil by AC electrical current flowing through the set of contacts and the load when the set of contacts are in the closed state in which the load receives AC electrical power from the AC power source.

These and other features, objects and advantages will be understood or apparent to those of ordinary skill in the art from the following detailed, description of the preferred embodiment as illustrated in the various drawing figures.

BRIEF DESCRIPTION OF DRAWINGS

FIGS. 2A and 2B are respectively relay side and microprocessor side plan views.

FIG. 3 is a schematic diagram depicting an isolated AC switching and sensing circuit of the type implemented on the printed circuit board depicted in FIGS. 2A-2C in accordance with a present disclosure's preferred embodiment in which electrical current for energizing an AC power control relay flows from a transistor through the relay's coil and a series connected resistor to circuit ground;

FIG. 3A is a schematic diagram depicting an opto isolator circuit that may replace a transformer included in the schematic diagram of FIG. 3;

BEST MODE FOR CARRYING OUT THE DISCLOSURE

Figure 1:
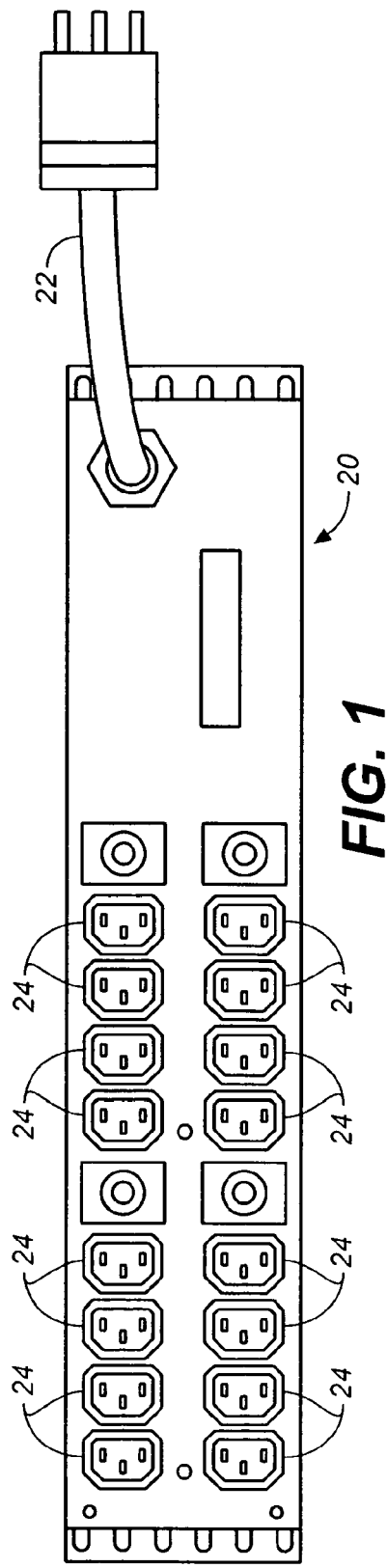
FIG. 1 is an elevational view of an electrical appliance for switching AC loads on and off that benefits significantly by concurrently monitoring AC electrical power supplied to one or more AC loads.

FIG. 1 depicts an elevational view of a rack-mountable electrical appliance for remotely controlling a supply of AC power that is sold by Digital Loggers, Inc. of Santa Clara, Calif., and that is referred to herein by the general reference character 20. Using a web browser and communicating via the Internet, the electrical appliance 20 permits starting or stopping any type of remotely located AC powered electrical equipment such as servers perhaps in a server farm, routers, firewalls, network devices, cell phone sites, ATM machines, kiosks, HVAC, industrial machinery and industrial process equipment. As depicted in FIG. 1 the electrical appliance 20 includes one (1) AC power input cable 22. The electrical appliance 20 also preferably includes a total of sixteen (16) NEMA 5-15R outlet plugs 24 from which external electrical equipment receives AC power. The electrical appliance 20 permits remotely controlling AC power to four (4) sets of four (4) outlet plugs 24 with each set of sets of four (4) outlet plugs 24 receiving AC electrical power from a separately controllable buss.

The electrical appliance 20 depicted in FIG. 1 is useful for eliminating service calls and increasing the reliable operation of remotely located equipment. Accessed via the Internet using a Web browser, the electrical appliance 20 permits remotely monitoring AC voltage, AC current, and AC power supplied individually to loads that connect via sets of the outlet plugs 24 to busses included in the electrical appliance 20. Four (4) full, digital voltage and current "meters" included in the electrical appliance 20 permit monitoring AC voltage, AC current; and AC power on each buss. To facilitate energy conservation, the electrical appliance 20 also permits remotely balancing phasing and load factor of AC power supplied to the remotely located equipment. A number of different functions that the electrical appliance 20 performs include eliminating overloads, brown-outs, blown circuit breakers and detecting other power problems before they occur.

Figure 2A:
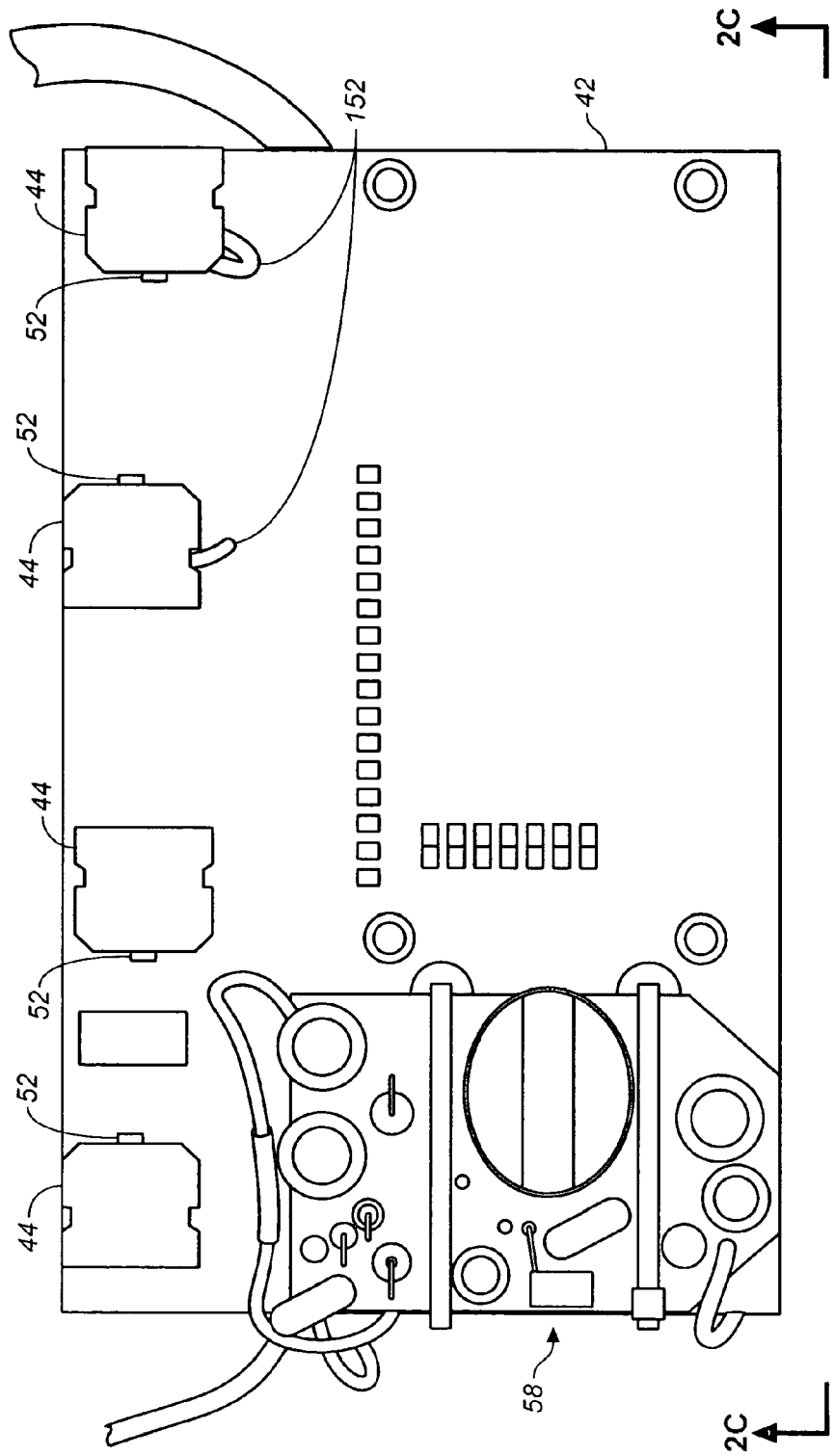
Figure 2C:
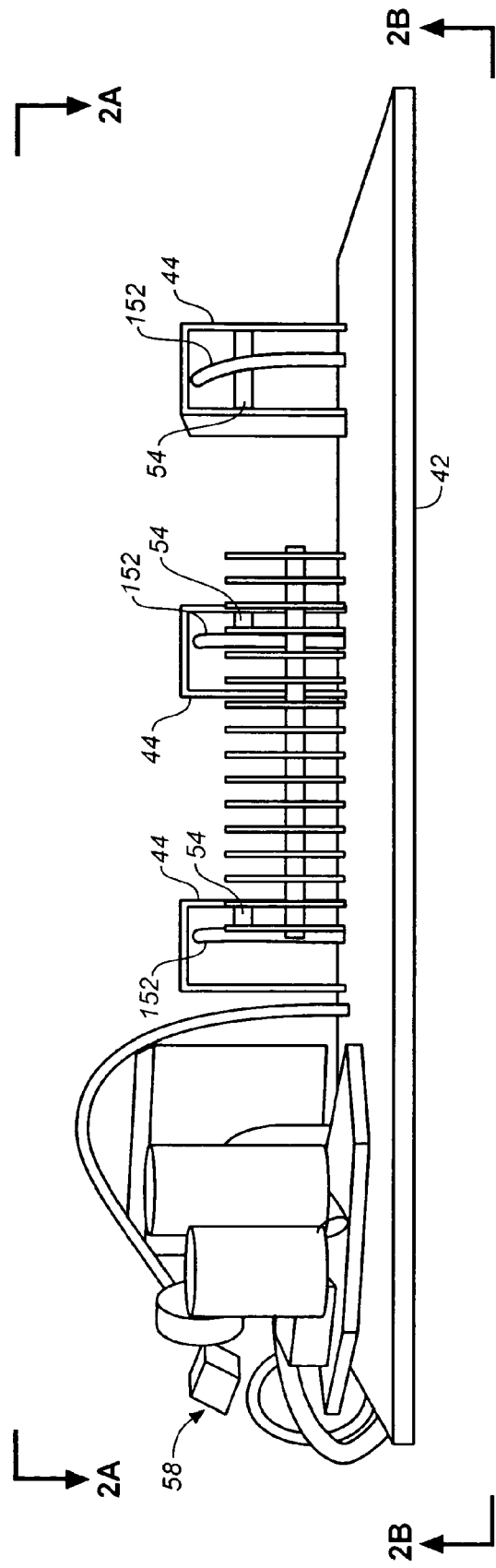
FIG. 2C is an elevational view of a printed circuit board included in the electrical appliance depicted in FIG. 1.

FIGS. 2A through 2C respectively depict alternative views of a printed circuit board assembly 42 which is included in the electrical appliance 20 depicted in FIG. 1. The printed circuit board assembly 42 has mounted thereon all the electrical components needed for a control and sensing circuit that selectively supplies AC electrical power to loads connected to the four (4) sets of outlet plugs 24 included in the electrical appliance 20. For purposes of the present disclosure, the most pertinent components included in the printed circuit board assembly 42 are four (4) relays 44 and a microcontroller 46.

As is readily apparent to those skilled in the relevant art, each relay 44 includes at least one set of contacts 52 that are connectable in series between:

1. a source of AC electrical power connected to the AC power input cable 22; and
2. a load connected to one of the outlet plugs 24.

Each of the relays 44 also includes an electromagnet formed by a coil 54 of insulated wire. Supplying an appropriate electrical current to the coil 54 of the relay 44 generates a magnetic field that changes the set of contacts 52 between:

1. a closed state in which the load receives AC electrical power via one of the outlet plugs 24; and
2. an open state in which the load does not receive AC electrical power.

As is also readily apparent to those skilled in the relevant art, whether supplying electrical current to the coil 54 supplies electrical power to the load or removes electrical power from the load depends upon the particular configuration of the set of contacts 52. If the relay 44 has a normally open set of contacts 52, supplying electrical current to the coil 54 causes the set of contacts 52 to close thereby supplying AC power to the load. Conversely, if the relay 44 has a normally closed set of contacts 52, supplying electrical current to the coil 54 causes the set of contacts 52 to open thereby removing AC power from the load.

The microcontroller 46 is preferably a Texas Instruments Incorporated ("TI") Piccolo Microcontroller model TMS320F28027. This particular microcontroller includes a single 12-bit analog-to-digital converter ("ADC") that receives signals from two (2) sample-and-hold circuits. The preferred microcontroller 46 provides sixteen (16) multiplexed inputs to the sample-and-hold circuits to equip the microcontroller with thirteen (13) general purpose analog input channels. The microcontroller 46 also includes sixteen (16) individually addressable registers for storing conversion results of analog-to-digital conversions produced by the ADC. The preferred microcontroller 46 also includes a set of multiplexed general purpose input/output ("GPIO") pins. The GPIO pins of the microcontroller 46 are programmable to function either in:

1. an input state that receives a digital signal;
2. an output state that transmits a digital signal; or
3. a high impedance state which disables the pin from performing either an input or an output function.

The printed circuit board assembly 42 also includes a DC power supply 58 for energizing operation of various components included in the electrical appliance 20 including the relays 44 and the microcontroller 46.

The schematic diagram of FIG. 3 depicts essential aspects of a preferred embodiment of a control and sensing circuit in accordance with the present disclosure respectively incorporated into each buss included in the electrical appliance 20. The schematic diagram of FIG. 3 depicts a load 72 connected to one of the outlet plugs 24 included in the electrical appliance 20. Specifically, an AC neutral wire included in the AC power input cable 22 connects directly through the electrical appliance 20 via the outlet plug 24 to the load 72. An AC line wire also included in the AC power input cable 22 connects to one of the set of contacts 52 included in the relay 44. The other of the set of contacts 52 connects via the outlet plug 24 to the load 72. The relay 44 depicted in FIG. 3 preferably has a normally open set of contacts 52 so that if a component failure occurs in the electrical appliance 20 electrical power will not be supplied to the outlet plug 24.

The control and sensing circuit depicted in the schematic of FIG. 3 also includes an NPN transistor 82 having an emitter 84 that collects to a first terminal 86 of the coil 54. The emitter 84 of the NPN transistor 82 also connects to a cathode 92 of a protection diode 94. An anode 96 of the protection diode 94 connects to circuit ground 102. A collector 104 of the NPN transistor 82 connects to a particular source of positive polarity direct current ("DC") electrical power 106, VCC, supplied by the DC power supply 58 that is reserved exclusively for energizing operation of relays 44. A second terminal 112 of the coil 54 connects via a resistor 114 to circuit ground 102. An output terminal 122 of a level shifting amplifier 124 connects to a base 126 of the NPN transistor 82 while an input terminal 132 of the level shifting amplifier 124 connects to a GPIO pin 134 of the microcontroller 46. Configured in this way, the NPN transistor 82 functions as a coil energizing switch that is connected in series:

1. with the coil 54; and
2. with the positive polarity DC electrical power 106 that provides a source of electrical power for energizing operation of the relay 44.

The microcontroller 46 includes a non-volatile memory 136 stores a computer program that is executed by a processor 138 also included in the microcontroller 46. This configuration for the control and sensing circuit permits the computer program to transmit a signal via the GPIO pin 134 and the level shifting amplifier 124 to the NPN transistor 82 for turning the NPN transistor 82 on and off. When the computer program executed by the processor 138 turn the NPN transistor 82 off, the NPN transistor 82 does not supply electrical current to the coil 54. Conversely, when the computer program executed by the processor 138 turn the NPN transistor 82 on, the NPN transistor 82 supplies electrical current to the coil 54 to change the normally open set of contacts 52 of the relay 44 between their open state and their closed state. While the schematic diagram of FIG. 3 depicts a single NPN transistor 82, a product such as the electrical appliance 20 that implements the disclosed control and sensing circuit preferably includes an integrated circuit ("IC") that provides several relay drivers each of which includes an NPN transistor and a diode, for example the ULN2803A "8CH Darlington Sink. Driver" marketed by Toshiba Corporation. As described above, when the set of contacts 52 are in a closed state the load 72 receives AC electrical power via the outlet plug 24.

When the set of contacts 52 are in their closed state and the load 72 receives AC electrical power, AC electrical current flowing through the set of contacts 52 induces an AC voltage across the terminals 86, 112 of the coil 54. Due to the configuration of the control and sensing circuit depicted in FIG. 3, the AC voltage induced across the terminals 86, 112 of the coil 54 appears as an AC modulation superimposed on a DC voltage that is present across the resistor 114 when electrical current flows through the coil 54.

As depicted in FIG. 3, a capacitor 142 connects between a junction of the resistor 114 with the second terminal 112 of the coil 54 and an input pin 144 of an ADC 146 that as described above is included in the preferred microcontroller

46. Configured in this way, the capacitor 142 couples the AC voltage present at the junction of the resistor 114 with the second terminal 112 of the coil 54 to the input pin 144 thereby permitting the ADC 146, at specified times determined by the computer program executed by the processor 138, to measure the AC voltage induced in the coil 54 by AC electrical current flowing through the set of contacts 52.

For the preferred embodiment of the control and sensing circuit depicted in FIG. 3, the AC line wire connected to one of the set of contacts 52 includes a loop of wire 152 wrapped around the coil 54 of the relay 44. Juxtaposing the loop of wire 152 with the coil 54 of the relay 44 increases the amplitude of the AC voltage induced across the coil 54 by AC electrical current flowing through the set of contacts 52. Increasing the amplitude of the voltage induced across the coil 54 by wrapping the loop of wire 152 around the coil 54 eliminates any need for an amplifier connected in series with the input pin 144 for supplying an output signal produced by the coil 54 to the ADC 146. Consequently, the loop of wire 152 wrapped around the coil 54 is merely an expedient and cost effective way of eliminating an amplifier and its associated circuitry from each buss included in the electrical appliance 20.

To permit most accurately determining pertinent characteristics of AC electrical current flowing through the load 72, the control and sensing circuit depicted in FIG. 3 also includes a transformer 162. As depicted in FIG. 3, the transformer 162 includes primary winding 164 that is connected across the AC neutral and line wires included in the AC power input cable 22. One end of a secondary winding 166 of the transformer 162 connects to circuit ground 102 while another end of the secondary winding 166 connects through a capacitor 172 to an input pin 174 of the ADC 146. The AC voltage applied to the input pin 174 by the transformer 162 via the capacitor 172 supplies an AC reference signal to the ADC 146. Digitized values of the AC reference signal produced by the ADC 146 are used by the computer program executed by the processor 138 in conjunction with digitized values for AC voltage applied to the input pin 144 from the coil 54 for accurately determining pertinent characteristics of AC electrical current flowing through the load 72.

In determining pertinent characteristics of AC electrical current flowing through the load 72, the computer program executed by the processor 138 preferably:

1. averages digital measurement produced by the ADC 146;
2. reduces noise present in the digital measurement produced by the ADC 146; and
3. compensates for characteristics of coupling between:
   a. AC electrical current flowing through the set of contacts 52 of the relay 44; and
   b. the coil 54.

The pertinent characteristics of AC electrical current flowing through the load 72 determined by the computer program executed by the processor 138 preferably include:

1. root mean square ("RMS") AC electrical current flowing through the load 72;
2. RMS AC voltage across the load 72;
3. actual AC electrical power dissipated in the load 72;
4. phase difference between:
   a. the voltage of AC power supplied to the electrical appliance 20 via the AC power input cable 22; and
   b. AC current flowing through the series connected set of contacts 52 and the load 72; and
5. power factor of AC electrical power being supplied to the load 72.

As is known to those skilled in the art, the power factor ("pf") of AC electric power being supplied to any load is defined as the ratio of:

1. the real AC power flowing to the load: divided by
2. the apparent AC power supplied to the load.

Real power represents the capacity of the circuit for performing work in a particular time. Apparent power is the product of the current and voltage of the circuit. Power factor is a dimensionless number between 0 and 1 that is frequently expressed as a percentage, e.g. 0.5 pf=50% pf. Due to energy stored in the load and returned to the source of AC power, or due to a non-linear load that distorts the wave shape of the current drawn from the source of AC power, apparent power exceeds real power. In an AC electric power system, for the same amount of useful work a load with low power factor draws more AC current than a load with a high power factor. Drawing more AC current:

1. increases the energy loss in the AC power distribution system, e.g. the AC power input cable 22; and
2. therefore requires larger wires and other equipment in the AC power distribution system.

Due to the expense of larger equipment and wasted electrical energy, electrical utilities usually charge industrial or commercial customers that have a low power factor more for AC power. Knowledgeable industrial or commercial customers seeking to minimize their AC power expense install additional electrical equipment to compensate for the power factor of their actual loads so the customer exhibit a power factor near 1.0 to the electrical utility from which they purchase AC power.

FIG. 3A depicts an alternative opto isolator circuit 182 that may be used instead of the transformer 162 for supplying AC voltage to an input pin of the ADC 146. Those elements of the opto isolator circuit 182 depicted in FIG. 3A that are common to the illustration of FIG. 3 are identified by the same reference numeral distinguished by a prime ("'") designation. The opto isolator circuit 182 includes a light emitting diode ("LED") 184 that connects in series with a resistor 186 to the AC neutral and line wires included in the AC power input cable 22'. Light emitted by the LED 184 impinges upon a photo-transistor 192 having an emitter 194 connected to circuit ground 102'. A collector 196 of the photo-transistor 192 connects through a resistor 202 to a particular source of positive polarity DC electrical power 204, VCC, supplied by the DC power supply 58 that is reserved exclusively for energizing logic circuits included in the control and sensing circuit depicted in FIG. 3 such as the microcontroller 46 and the level shifting amplifier 124. The opto isolator circuit 182 depicted in FIG. 3A produces an AC voltage at, the junction between the collector 196 of the photo-transistor 192 and the resistor 202 that is in phase with AC voltage across the AC neutral and line wires included in the AC power input cable 22'. Similar to the AC voltage produced by the secondary winding 166 of the transformer 162 depicted in FIG. 3, the AC voltage present at the junction between the collector 196 of the photo-transistor 192 and the resistor 202 depicted in FIG. 3A is coupled through a capacitor 172' to the input pin 174' of the microcontroller 46'. In general, the opto isolator circuit 182 costs less and is physically smaller than the transformer 162. However, using the opto isolator circuit 182 results in an AC power measurement system which is less accurate at monitoring AC voltage supplied to the electrical appliance 20 than the control and sensing circuit depicted in FIG. 3 that uses the transformer 162.

In the control and sensing circuit depicted in FIG. 3, due to the electrical current which the NPN transistor 82 supplies to the coil 54 the changing magnetic flux produced by AC current flowing through the set of contacts 52 that couples into the coil 54 generates a voltage that appears as an AC modulation superimposed upon a constant DC voltage that is present across the resistor 114. Because the changing magnetic flux produced by AC current flowing through the set of contacts 52 appears as a modulation superimposed upon the constant DC voltage present across the resistor 114, the positive polarity DC electrical power 106 supplied by the DC power supply 58 is preferably well regulated and has as little AC ripple as practicable.

Figure 4:
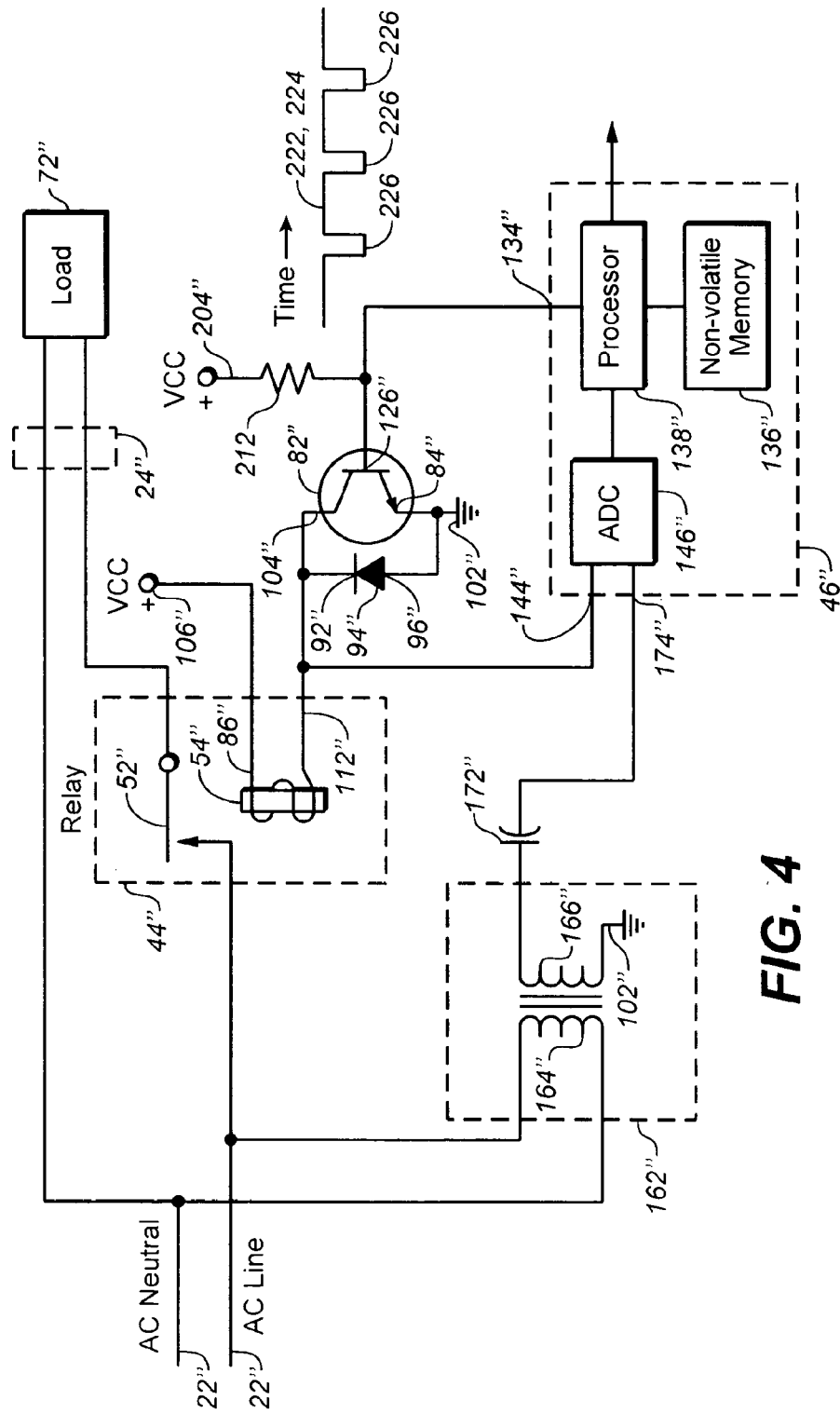
FIG. 4 is a schematic diagram depicting an isolated AC switching and sensing circuit in accordance with an alternative embodiment of the present disclosure in which electrical current for energizing an AC power control relay flows from the relay's coil through only transistor to circuit ground.

The schematic diagram of FIG. 4 depicts essential aspects of an alternative embodiment control and sensing circuit in accordance with the present disclosure as might be respectively incorporated into each buss included in the electrical appliance 20. Those elements depicted in FIG. 4 that are common to the illustration of FIG. 3 are identified by the same reference numeral distinguished by a double prime ("″") designation. Significant differences between the control and sensing circuit depicted in FIG. 3 and the alternative circuit depicted in FIG. 4 include omission of:

1. the level shifting amplifier 124;
2. the capacitor 142; and
3. the loop of wire 152.

Significant topological differences between the control and sensing circuit depicted in FIG. 3 and the alternative circuit depicted in FIG. 4 include connecting:

1. the first terminal 86″ of the coil 54″ directly to the positive polarity DC electrical power 106″;
2. the collector 104″ of the NPN transistor 82″ to the junction of:
   a. the cathode 92″ of the protection diode 94″; and
   b. the second terminal 112″ of the relay 44″;
3. the emitter 84″ of the NPN transistor 82″ to circuit ground 102″;
4. the input pin 144″ of the microcontroller 46″ directly to the junction of:
   a. the cathode 92″ of the protection diode 94″;
   b. the second terminal 112″ of the relay 44″; and
   c. the collector 104″ of the NPN transistor 82″; and
5. the base 126″ of the NPN transistor 82″ directly to the GPIO pin 134″ of the microcontroller 46″.

Yet Another significant difference between the control and sensing circuit depicted in FIG. 3 and the alternative circuit depicted in FIG. 4 is the addition of a resistor 212 connected between the positive polarity DC electrical power 204″ and the junction between the base 126″ of the NPN transistor 82″ and the GPIO pin 134″ of the microcontroller 46″.

The component and topological differences between the control and sensing circuit depicted in the schematic diagram of FIG. 4 and the preferred control and sensing circuit depicted in FIG. 3 compel a different operating procedure in obtaining digitized values for induced AC voltage supplied from the coil 54″ to the input pin 144″ of the microcontroller 46″. Because in the control and sensing circuit depicted in FIG. 4 energizing the coil 54″ to close the set of contacts 52″ for supplying AC power to the load 72″ requires that the NPN transistor 82″ be turned on and in a low impedance state, while the NPN transistor 82″ is turned on AC current flowing through the set of contacts 52″ induces little or no AC voltage at the second terminal 112″ of the relay 44″. However, induced AC voltage supplied from the coil 54″ to the input pin 144″ of the microcontroller 46″ immediately becomes significant upon turning the NPN transistor 82″ off. Consequently, a timing diagram 222 included in FIG. 4 depicts a signal 224 that the processor 138″ supplies to the base 126″ of the NPN transistor 82″ via the GPIO pin 134″ during an interval in which the set of contacts 52″ are closed and the load 72″ receives AC power. As depicted in the timing diagram 222, the signal supplied to the base 126″ of the NPN transistor 82″ includes repetitive brief interruptions 226 during which the NPN transistor 82″ turns off. The duration of each of the brief interruptions 226 are so short that the remanent electromagnetic field generated by the coil 54″ and the mechanical inertia of the set of contacts 52″ maintain a continuous supply of AC power to the load 72″. However, during each of the brief interruptions 226 while the NPN transistor 82″ does not does not supply electrical current to the coil 54″, the ADC 146″ of the microcontroller 46″ measures the induced AC voltage supplied from the second terminal 112″ of the coil 54″ to the input pin 144″.

While the alternative embodiment control and sensing circuit in accordance with the present disclosure depicted in FIG. 4 permits measuring an AC voltage induced in the coil 54″ by AC electrical current flowing through the set of contacts 52″ and the load 72″ when the set of contacts 52″ are in the closed state, in comparison with the control and sensing circuit depicted in FIG. 3 repetitively turning the NPN transistor 82″ off and then on during each of the brief interruptions 226 introduces a significant amount of electrical noise into AC voltage measurements produced by the ADC 146″.

Figure 5:
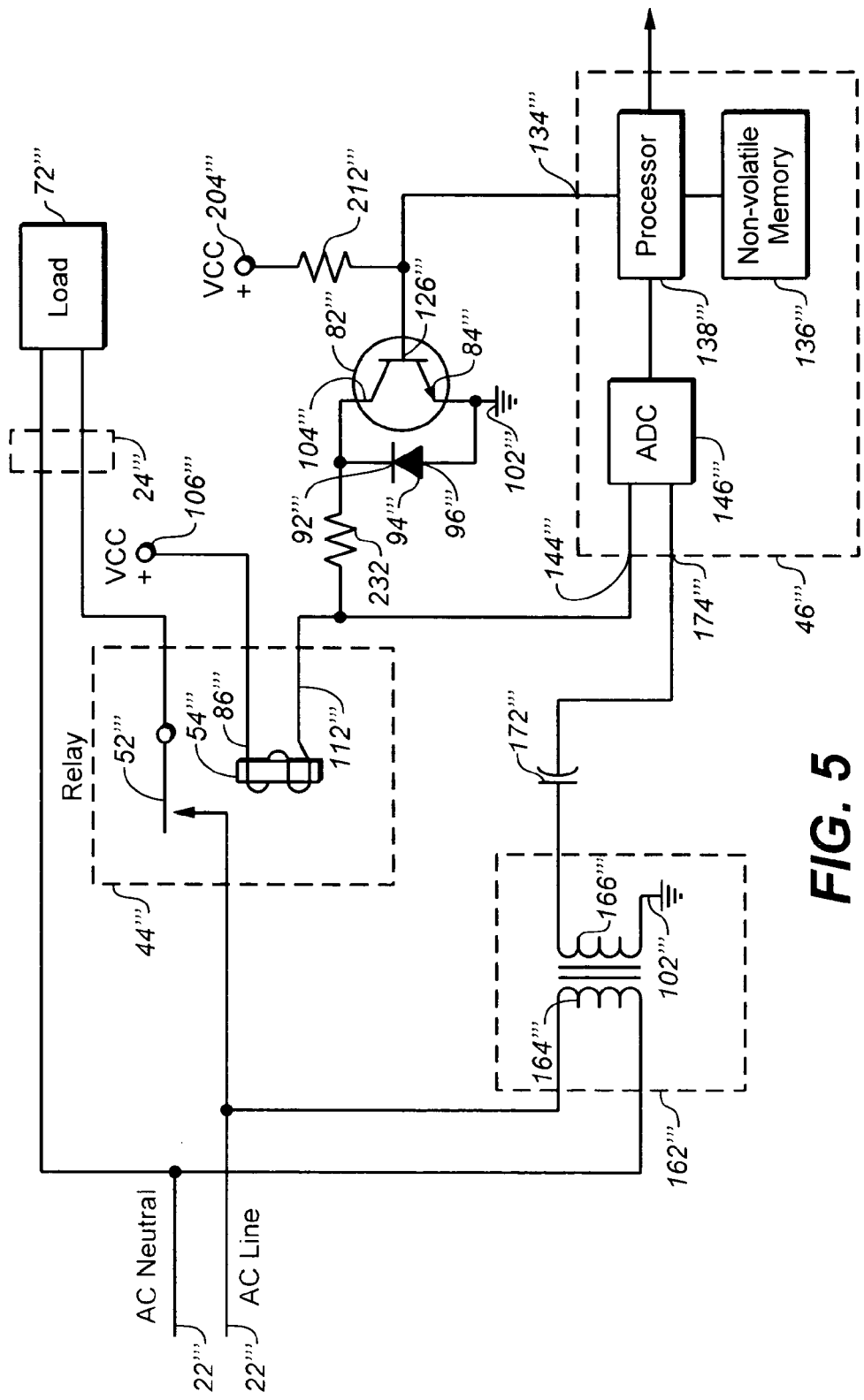
FIG. 5 is a schematic diagram depicting an isolated AC switching and sensing circuit in accordance with another embodiment of the present disclosure in which electrical current for energizing an AC power control relay from the relay's coil through a series connected resistor and transistor to circuit ground.

The schematic diagram of FIG. 5 depicts essential aspects of yet another alternative embodiment control and sensing circuit in accordance with the present disclosure as might be respectively incorporated into each buss included in the electrical appliance 20. Those elements depicted in FIG. 5 that are common to the illustrations of FIGS. 3 and 4 are identified by the same reference numeral distinguished by a triple prime ("‴") designation. The only significant difference between the control and sensing circuit depicted in FIG. 4 and the alternative embodiment circuit depicted in FIG. 5 is the addition of a resistor 232 connected between the junction of the cathode 92‴ of the protection diode 94‴ with the collector 104‴ of the NPN transistor 82‴ and the second terminal 112‴ of the relay 44‴. Adding the resistor 232 between the junction of the cathode 92‴ of the protection diode 94‴ with the collector 104‴ of the NPN transistor 82‴ and the second terminal 112‴ of the relay 44‴ permits AC current flowing through the set of contacts 52‴ to induces a significant AC voltage at the junction between the second terminal 112‴ of the relay 44‴ and the resistor 232 while the NPN transistor 82‴ is turned on. Consequently, operation of the alternative embodiment control and sensing circuit depicted if FIG. 5 may dispense with the brief interruptions 226‴ in the timing diagram 222‴ depicting the signal 224‴ applied to the base 126‴ of the NPN transistor 82‴

While, in principle both of the alternative embodiment control and sensing circuits depicted respectively in FIGS. 4 and 5 will operate properly without the capacitor 142 included in the circuit depicted in FIG. 3, adding the capacitor 142 to the circuits depicted in FIGS. 4 and 5 ensures that the full sensitivity of the ADC 146 is available for digitizing the AC voltage induced in the coil 54. Omitting the capacitor 142 from the control and sensing circuit depicted respectively in FIGS. 4 and 5 means that the ADC 146 digitizes a voltage which is the sum of a DC voltage that results from relay energizing current that the NPN transistor 82 supplies to the coil 54 plus the AC voltage induced in the coil 54 by AC electrical current flowing through the set of contacts 52 and the load 72 when the set of contacts 52 are in the closed state.

Figure 6:
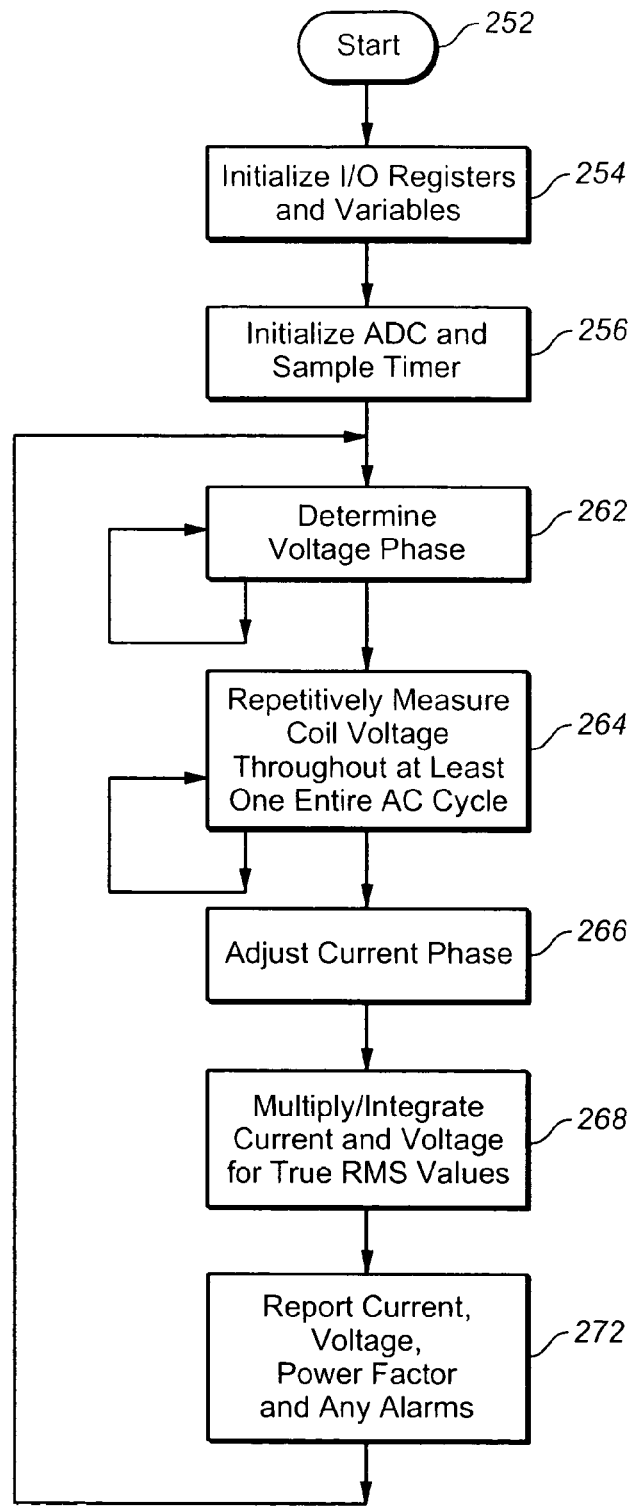
FIG. 6 is a flow diagram depicting the preferred method for determining AC current, voltage and power factor for AC electrical power supplied to a load via a set of closed relay contacts from voltage induced in the relay's coil by current flowing through the closed contacts.

The flow diagram of FIG. 6 depicts the preferred method for determining AC current, voltage and power factor for AC electrical power supplied to loads 72 via the set of contacts 52 from voltage induced in the coil 54 by current flowing through the closed set of contacts 52. The preferred method begins at a start block 252 which the computer program executed by the processor 138 enters shortly after AC power is applied to the electrical appliance 20. First, the method in processing block 254 initialized input/output ("I/O") registers included in the microcontroller 46 and assigns initial values to variables that are used in determining AC current, voltage and power factor for AC electrical power supplied to loads 72 via the set of contacts 52. Having initialized the I/O registers and variables, the method in processing block 256 then initializes both the ADC 146 and a timer included in the microcontroller 46 whose operation determines moments in time at which the ADC 146 measures the AC voltage induced in the coil 54 by AC electrical current flowing through the set of contacts 52. Preferably, operation of the timer causes the ADC 146 to measure AC voltage induced across each of the coils 54 two-hundred and fifty-six (256) times during each cycle of the AC power. For 60 Hz AC power, the timer causes the ADC 146 to measure AC voltage induced across each of the coils 54 two-hundred and fifty-six (256) times during a 16.67 msec interval, i.e. 1.0 second/60 cycles.

Having completed initialization of the microcontroller 46, the computer program executed by the processor 138 is now ready to begin repetitively determining AC current, voltage and power factor for AC electrical power supplied to loads 72 via the set of contacts 52 from voltage induced in the coil 54 by current flowing through the closed set of contacts 52. The processor 138 preferably executes a multi-tasking real time operating system that permits concurrently executing a number of independent computer program threads. Thus, after completing the initialization described in the preceding paragraph, for the electrical appliance 20 depicted in FIGS. 1 and 2A-2C, the computer program executed by the processor 138 begins concurrently running five (5) instances of the method depicted along the right-hand side of FIG. 6. Four (4) instances of the method depicted along the right-hand side of FIG. 6 are respectively assigned to processing voltage induced across one of the four (4) coils 54. The fifth (5th) instances of the method depicted along the right-hand side of FIG. 6 processes the reference AC voltage signal supplied to the microcontroller 46 by the transformer 162.

Determining AC current, voltage and power factor for AC electrical power supplied to loads 72 via the set of contacts 52 from voltage induced in the coil 54 by current flowing through the closed set of contacts 52 begins in processing block 262 with individual computer program threads respectively determining the phase of AC voltage that the microcontroller 46 receives from the transformer 162 or from each of the coils 54. In determining the phase of AC voltage being digitized by the ADC 146, the computer program repetitively measures voltage until AC voltage crosses zero. The instant at which AC voltage crosses zero becomes a zero (0) reference point for two-hundred and fifty-six (256) measurements of voltage from the transformer 162 or from a coil 54 that occur throughout one cycle of AC power. It is important to note that for the electrical appliance 20 depicted in FIGS. 1 and 2A-2C each of the two-hundred and fifty-six (256) voltage measurements occurring throughout the method depicted along the right-hand side of FIG. 6 is, in fact, computed by averaging sixteen (16) independent voltage measurements made by the ADC 146 throughout an interval that, depending upon clock speed of the preferred microcontroller 46, does not exceed eight (8) microseconds.

After determining the zero (0) reference point, i.e. phase ($\phi$)=0 in processing block 262, determining AC current, voltage and power factor for AC electrical power supplied to loads 72 then proceeds to processing block 264 which collects two-hundred fifty-six (256) voltage measurements throughout an entire cycle of AC power. For the presently preferred embodiment of the electrical appliance 20 operating with 60 Hz AC electrical power, two hundred and fifty-six (256) measurements are collected at processing block 264 throughout a 16.67 msec interval of time.

After collecting two-hundred fifty-six (256) measurements of AC voltage either from the transformer 162 or from the coil 54 of the relay 44 throughout an entire cycle of AC power, the preferred method for determining AC current, voltage and power factor for AC electrical power supplied to loads 72 via the set of contacts 52 in processing block 266 compensate the voltage measurements for characteristics either of the transformer 162 or for coupling between AC electrical current flowing through the set of contacts 52 and the coil 54 of the relay 44. A preferred method for determining compensation to be applied to the voltage measurements appears in FIG. 7 and is described in greater detail below.

Having obtained compensated voltage measurements in processing block 266, the preferred method for determining AC current, voltage and power factor for AC electrical power supplied to loads 72 via the set of contacts 52 in processing block 268 multiplies or integrates the voltage measurements to obtain RMS values respectively for voltage supplied to the microcontroller 46 by the transformer 162 or for current flowing through the set of contacts 52 of each of the relays 44. Having obtained RMS values respectively for voltage supplied to the microcontroller 46 by the transformer 162 or for current flowing through the set of contacts 52 of each of the relays 44, in processing block 272 the preferred method for determining AC current, voltage, power factor and actual true power dissipation for AC electrical power supplied to loads 72 via the set of contacts 52 reports current, voltage and power factor for each of loads 72, and any alarms for electrical power being supplied to the electrical appliance 20, or being supplied to any of loads 72 during a single cycle of that electrical power. As depicted in FIG. 6, after the preferred method for determining AC current, voltage and power factor for AC electrical power supplied to loads 72 via the set of contacts 52 each of the threads being of the computer program being executed by the processor 138 returns to processing block 262 to process the next cycle of the AC power.

Figure 7:
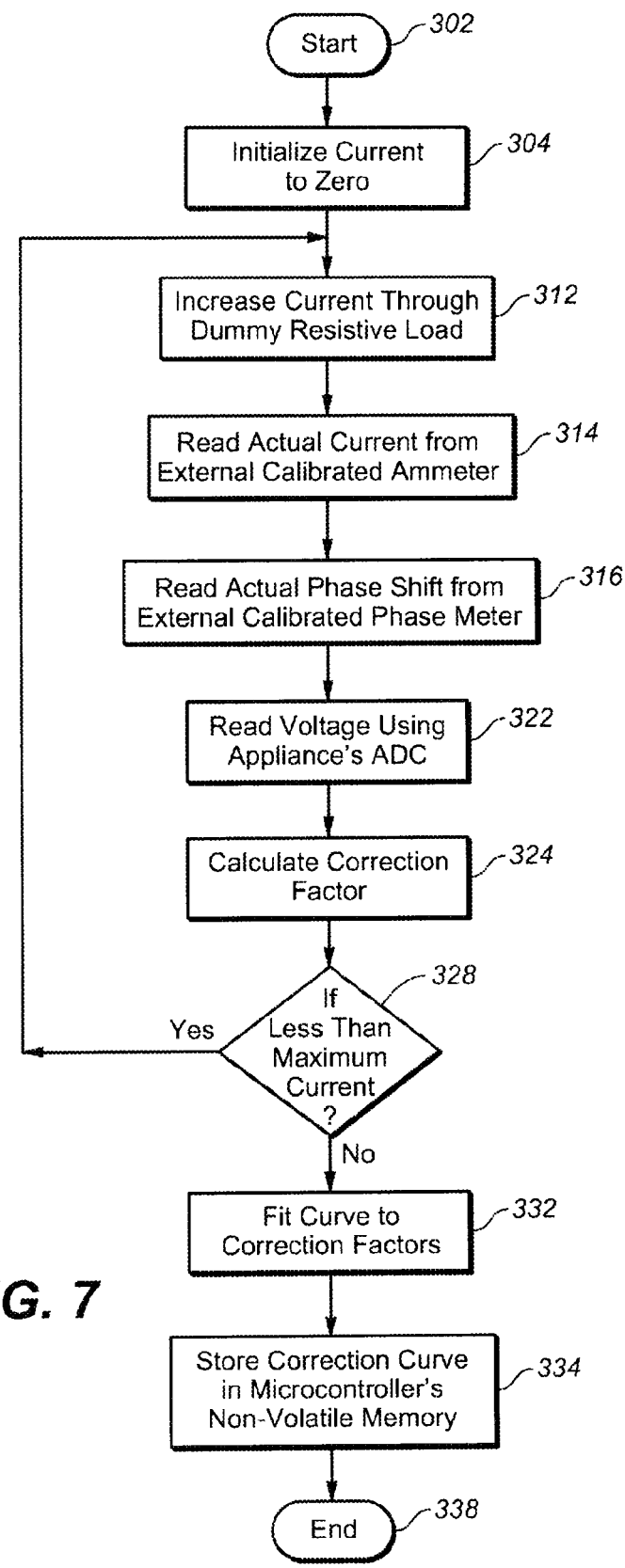
FIG. 7 is a flow diagram depicting the preferred method for determining compensation to be applied to voltage measurements collected while determining AC current, voltage and power factor for AC electrical power supplied to a load.

The flow diagram of FIG. 7 depicts the preferred method for determining compensation to be applied to measurements of AC voltage that are subsequently used in processing block 266 depicted in FIG. 6. The method depicted in FIG. 7, which is used solely for calibrating the electrical appliance 20 prior to its installation, requires additional equipment that is not included in the electrical appliance 20. Accordingly, while determining compensation to be applied to measurements of AC voltage a programmable dummy resistive load is connected to the outlet plugs 24. The dummy resistive load preferably permits programming two-hundred and fifty-six (256) different resistances with only a single dummy resistive load being connected in series with all the set of contacts 52 of all relays 44 included in the electrical appliance 20. Also a computer readable calibrated ammeter and calibrated phase meter are connected to the electrical appliance 20 while determining compensation to be applied to AC voltage measurements. Lastly, before determining actual compensation values to be applied to AC voltage measurements and storing the compensation values into the non-volatile memory 136 of the microcontroller 46:
1. values of one (1.0) are stored in the non-volatile memory 136; and
2. during determination of compensation to be applied to measurements of AC voltage, the values of one (1.0) are used in processing block 266 by the computer program executed by the processor 138 while executing the method depicted in FIG. 6.

FIGS. 1-7 do not illustrate any of the additional equipment required for determining compensation to be applied to measurements of AC voltage.

Determining compensation to be applied to measurements of AC voltage that are used in processing block 266 depicted in FIG. 6 begins in start block 302 that is immediately followed in processing block 304 which disconnects all resistance from the outlet plugs 24 of the electrical appliance 20, i.e. sets to zero (0) the current that the dummy resistive load simulates as flowing through each of the set of contacts 52. After setting the current to zero (0), the computer program for determining compensation to be applied to measurements of AC voltage that are used in processing block 266 enters for the first time processing block 312 which increases by one step the AC current flowing through the set of contacts 52 of the relay 44 and the dummy resistive load. After increasing the AC current by one step, the computer program determining compensation to be applied to measurements of AC voltage in processing step 314 reads the actual current flowing through the set of contacts 52 and the dummy resistive load from the external calibrated ammeter. Immediately after reading the AC current flowing through the set of contacts 52 and the dummy resistive load, the computer program determining compensation to be applied to measurements of AC voltage in processing step 316 reads from the external calibrated phase meter the actual phase shift of AC current flowing through the set of contacts 52 and the dummy resistive load.

Having in the preceding way determined accurately both the AC current flowing through the set of contacts 52 and the dummy resistive load and the phase of that current flow with respect to the AC power being supplied to the electrical appliance 20, the computer program determining compensation to be applied to measurements of AC voltage in processing step 322 using the ADC 146 reads the AC voltage being supplied to the microcontroller 46 by the set of contacts 52' of relays 44. Having thus obtained an AC voltage and phase thereof induced in the coil 54 by AC current flowing through the set of contacts 52 and the dummy resistive load, the computer program executed by the processor 138 in processing block 324 then computes a correction factor that when multiplied by the AC voltage and phase as measured by the ADC 146 would set the products equal to the AC current and phase read respectively in processing blocks 314 and 316. After computing the correction factor for a particular value of current flowing through the set of contacts 52, the computer program proceeds to decision block 328. If in decision block 328 the computer program determines that the current for which a correction factor was just computed is less than the maximum current that can be supplied to a load 72 via the outlet plug 24, then the computer program returns to processing block 312 in order to determine a correction factor for the next greater current to flow through the set of contacts 52 and the dummy resistive load.

If in decision block 328 the computer program determines that the current for which a correction factor was just computed in processing block 324 equals the maximum current that can be supplied to a load 72 via the outlet plug 24, then computer program execution proceeds to processing block 332 where a curve is fit to the set of correction factors determined by performing the operations specified for processing blocks 312 through 324. After fitting a curve to the set of correction factors, the computer program executed by the processor 138 in processing block 334 stores the correction curve into the non-volatile memory 136 of the microcontroller 46:

1. thereby completing determination of compensation to be applied to measurements of AC voltage that are used in processing block 266 depicted in FIG. 6; and
2. immediately thereafter terminating computer program execution in end block 338.

Set forth below is a computer program written in C++ that is executed by the processor 138.

Industrial Applicability

Although the present invention has been described in terms of the presently preferred embodiment, it is to be understood that such disclosure is purely illustrative and is not to be interpreted as limiting. For example, while the control and sensing circuits respectively depicted in FIGS. 3, 4 and 5 include the transformer 162 to provide an accurate reference signal for AC power received by the electrical appliance 20, the computer program executed by the processor 138 can numerically assess less accurately phase difference between:

1. the voltage of AC power supplied to the electrical appliance 20 via the AC power input cable 22; and
2. AC current flowing through the series connected set of contacts 52 and the load 72.

Therefore, sacrificing precision a control and sensing circuit in accordance with the present disclosure may omit the transformer 162.

As described above for the control and sensing circuit depicted in FIG. 3, the loop of wire 152 juxtaposed with the coil 54 increases magnetic coupling between AC current flowing through the set of contacts 52 and the load 72. If as depicted in FIGS. 2A-2C the relays 44 are mounted on a printed circuit board, the AC current flowing through the set of contacts 52 can be routed instead through one or more PCB traces that are:

1. near the mounting location of the relays 44: and
2. arranged with respect to the coil 54 to increase coupling between the magnetic field produced by the AC current flowing through the set of contacts 52 and the load 72.

For increased safety the relay 44 preferably has a normally open set of contacts 52 so a load 72 receives AC electrical power only if the electrical appliance 20 operates properly. However, an equivalently safe circuit can be implemented using a relay 44 having a normally closed set of contacts 52 if the set of contacts 52 connect to the source of electrical power in series with another relay having normally open contacts. Sensing AC electrical current flowing through a load and a set of normally closed set of contacts 52 included in a circuit such as that depicted in FIG. 4 or 5 provides a better voltage signal from the coil 54 to the microcontroller 46 because the NPN transistor 82 will be turned off when AC electrical current flows through the load 72 thereby leaving the second terminal 112 of the coil 54 electrically coupled to only the input pin 144 of the microcontroller 46.

Another alternative is a electrical appliance 20 in accordance with the present disclosure that also includes outlet plugs 24 which provide AC power that cannot be controlled remotely to devices that must always operate. To prevent unexpected shutdowns or start-ups, the electrical appliance 20 may also include front panel switches for selectively locking AC electrical power either on or off to sets of outlet plugs 24 that are remotely controllable.

Consequently, without departing from the spirit and scope of the disclosure, various alterations, modifications, and/or alternative applications of the disclosure will, no doubt, be suggested to those skilled in the art after having read the preceding disclosure. Accordingly, it is intended that the following claims be interpreted as encompassing all alterations, modifications, or alternative applications as fall within the true spirit and scope of the disclosure.

What is claimed is:

1. A control and sensing circuit for selectively supplying alternating current ("AC") electrical power to a load, the control and sensing circuit comprising:
   a. a relay that includes:
      i. at least one set of contacts that are connectable in series between a source of AC electrical power and the load; and
      ii. an electromagnet that includes a coil of insulated wire which upon supplying an electrical current to the coil changes the set of contacts between:
         A. a closed state in which the load receives AC electrical power; and
         B. an open state in which the load does not receive AC electrical power,
         the load and the set of contacts being connectable in series so electrical current flows therethrough from the source of AC electrical power only exterior to the coil of said electromagnet;
   b. a coil energizing switch connected in series with the coil and with a source of relay energizing electrical power which coil energizing switch:
      i. in a first state does not supply electrical current to the coil; and
      ii. in a second state supplies electrical current to the coil for changing the set of contacts between the open state and the closed state; and
   c. an AC voltage sensing circuit coupled to the coil for measuring an AC voltage induced in the coil by AC electrical current that flows only exterior to the coil of said electromagnet through the set of contacts and the load when the set of contacts are in the closed state in which the load receives AC electrical power from the source thereof.

2. The control and sensing circuit of claim 1 wherein the AC voltage sensing circuit measures the induced AC voltage during a brief interval throughout which the coil energizing switch does not does not supply electrical current to the coil.

3. The control and sensing circuit of claim 1 wherein measurement of the induced AC voltage by the AC voltage sensing circuit is synchronized with AC electrical power supplied by the source of AC electrical power.

4. The control and sensing circuit of claim 1 wherein the AC voltage sensing circuit also receives an AC reference signal that is in phase with voltage of the source of AC electrical power thereby permitting the control and sensing circuit to determine any phase difference between AC electrical current flowing through the load and voltage of the source of AC electrical power.

5. The control and sensing circuit of claim 1 wherein the AC voltage sensing circuit determines from the measurement of induced AC voltage a characteristic of AC electrical power supplied to the load selected from a group consisting of:
   a. root mean square ("RMS") AC electrical current flowing through the load;
   b. RMS AC voltage across the load;
   c. power factor of AC electrical power being supplied to the load; and
   d. AC electrical power dissipated in the load.

6. The control and sensing circuit of claim 1 wherein the measurement of AC electrical current produced by the AC voltage sensing circuit is compensated for characteristics of coupling between AC electrical current flowing through:
   a. the set of contacts of the relay; and
   b. the coil of the relay.

7. The control and sensing circuit of claim 1 wherein the AC voltage sensing circuit includes an analog-to-digital converter ("ADC") that is coupled to the coil for measuring the induced AC voltage.

8. The control and sensing circuit of claim 7 wherein the AC voltage sensing circuit further includes a capacitor connected in series between the coil and the ADC.

9. The control and sensing circuit of claim 7 further including a processor that processes digital measurements produced by the ADC of the induced AC voltage by performing an operation selected from a group consisting of:
   a. averaging the digital measurement;
   b. reducing noise present in the digital measurement;
   c. compensating for characteristics of coupling between:
      i. AC electrical current flowing through the set of contacts of the relay; and
      ii. the coil of the relay;
   d. determining a characteristic of AC electrical power supplied to the load selected from a group consisting of:
      i. RMS AC electrical current flowing through the load;
      ii. RMS AC voltage across the load;
      iii. AC electrical power dissipated in the load;
      iv. power factor of AC electrical power being supplied to the load; and
      v. actual true power dissipation measured in units selected from a group consisting of watt-hours and kilowatt-hours, the actual true power dissipation being determined using the determined power factor.

10. The control and sensing circuit of claim 1 wherein the set of contacts are in the closed state when the coil energizing switch supplies electrical current to the coil.

11. The control and sensing circuit of claim 10 further comprising a length of electrically conductive material connected in series with the set of contacts that is juxtaposed with the coil for increasing coupling between the coil and AC electrical current flowing through the set of contacts and the load.

12. The control and sensing circuit of claim 1 wherein the set of contacts are in the open state when the coil energizing switch supplies electrical current to the coil.

13. An electrical appliance whose operation is energized by AC electrical power, the electrical appliance comprising:
   a. a load that receives AC electrical power; and
   b. a control and sensing circuit for selectively supplying AC electrical power to the load, the control and sensing circuit including:
      i. a relay that includes:
         A. at least one set of contacts that are connectable in series between a source of AC electrical power and the load; and
         B. an electromagnet that includes a coil of insulated wire which upon supplying an electrical current to the coil changes the set of contacts between:
            I. a closed state in which the load receives AC electrical power; and
            II. an open state in which the load does not receive AC electrical power,
         the load and the set of contacts being connected in series so electrical current flows therethrough from the source of AC electrical power only exterior to the coil of said electromagnet;
      ii. a coil energizing switch connected in series with the coil and with a source of relay energizing electrical power which coil energizing switch:

A. in a first state does not supply electrical current to the coil; and

B. in a second state supplies electrical current to the coil for changing the set of contacts between the open state and the closed state; and iii. an AC voltage sensing circuit coupled to the coil for measuring an AC voltage induced in the coil by AC electrical current that flows only exterior to the coil of said electromagnet through the set of contacts and the load when the set of contacts are in the closed state in which the load receives AC electrical power from the source thereof.

14. The control and sensing circuit included in the electrical appliance of claim 13 wherein the AC voltage sensing circuit measures the induced AC voltage during a brief interval throughout which the coil energizing switch does not does not supply electrical current to the coil.

15. The control and sensing circuit included in the electrical appliance of claim 13 wherein measurement of the induced AC voltage by the AC voltage sensing circuit is synchronized with AC electrical power supplied by the source of AC electrical power.

16. The control and sensing circuit included in the electrical appliance of claim 13 wherein the AC voltage sensing circuit also receives an AC reference signal that is in phase with voltage of the source of AC electrical power thereby permitting the control and sensing circuit to determine any phase difference between AC electrical current flowing through the load and voltage of the source of AC electrical power.

17. The control and sensing circuit included in the electrical appliance of claim 13 wherein the AC voltage sensing circuit determines from the measurement of induced AC voltage a characteristic of AC electrical power supplied to the load selected from a group consisting of:
  a. root mean square ("RMS") AC electrical current flowing through the load;
  b. RMS AC voltage across the load;
  c. power factor of AC electrical power being supplied to the load; and
  d. AC electrical power dissipated in the load.

18. The control and sensing circuit included in the electrical appliance of claim 13 wherein the measurement of AC electrical current produced by the AC voltage sensing circuit is compensated for characteristics of coupling between AC electrical current flowing through:
  a. the set of contacts of the relay; and
  b. the coil of the relay.

19. The control and sensing circuit included in the electrical appliance of claim 13 wherein the AC voltage sensing circuit includes an ADC that is coupled to the coil for measuring the induced AC voltage.

20. The control and sensing circuit included in the electrical appliance of claim 19 wherein the AC voltage sensing circuit further includes a capacitor connected in series between the coil and the ADC.

21. The control and sensing circuit included in the electrical appliance of claim 19 further including a processor that processes digital measurements produced by the ADC of the induced AC voltage by performing an operation selected from a group consisting of:
  a. averaging the digital measurement;
  b. reducing noise present in the digital measurement;
  c. compensating for characteristics of coupling between:
    i. AC electrical current flowing through the set of contacts of the relay; and
    ii. the coil of the relay;
  d. determining a characteristic of AC electrical power supplied to the load selected from a group consisting of:
    i. RMS AC electrical current flowing through the load;
    ii. RMS AC voltage across the load;
    iii. AC electrical power dissipated in the load;
    iv. power factor of AC electrical power being supplied to the load; and
    v. actual true power dissipation measured in units selected from a group consisting of watt-hours and kilowatt-hours, the actual true power dissipation being determined using the determined power factor.

22. The control and sensing circuit included in the electrical appliance of claim 13 wherein the set of contacts are in the closed state when the coil energizing switch supplies electrical current to the coil.

23. The control and sensing circuit included in the electrical appliance of claim 22 further comprising a length of electrically conductive material connected in series with the set of contacts that is juxtaposed with the coil for increasing coupling between the coil and AC electrical current flowing through the set of contacts and the load.

24. The control and sensing circuit included in the electrical appliance of claim 13 wherein the set of contacts are in the open state when the coil energizing switch supplies electrical current to the coil.

25. A method for selectively supplying AC electrical power to a load, the method comprising the steps of:
  a. supplying AC electrical current to the load through at least one set of contacts of a relay, the set of contacts being connectable in series between a source of AC electrical power and the load, the relay also including an electromagnet that includes a coil of insulated wire which upon receiving an electrical current changes the set of contacts between:
    i. a closed state in which the load receives AC electrical power; and
    ii. an open state in which the load does not receive AC electrical power,
    the load and the set of contacts being connectable in series so electrical current flows therethrough from the source of AC electrical power only exterior to the coil of said electromagnet;
  b. supplying electrical current to the coil of the relay via a coil energizing switch connected in series with the coil and with a source of relay energizing electrical power, the coil energizing switch being operable:
    i. in a first state in which the coil does not receive electrical current; and
    ii. in a second state in which the coil receives electrical current for changing the set of contacts between the open state and the closed state; and
  c. measuring an AC voltage induced in the coil by AC electrical current that flows only exterior to the coil of said electromagnet through the set of contacts and the load when the set of contacts are in the closed state in which the load receives AC electrical power from the source thereof.

26. The method of claim 25 wherein measuring the AC voltage induced in the coil by AC electrical current flowing through the set of contacts occurs during a brief interval throughout which the coil energizing switch does not does not supply electrical current to the coil.

27. The method of claim 25 wherein measuring induced AC voltage by the AC voltage sensing circuit is synchronized with AC electrical power supplied by the source of AC electrical power.

28. The method of claim 25 wherein receiving an AC reference signal that is in phase with voltage of the source of AC electrical power by the AC voltage sensing circuit permits the control and sensing circuit to determine any phase difference between AC electrical current flowing through the load and voltage of the source of AC electrical power.

29. The method of claim 25 further comprising the step of the AC voltage sensing circuit determining from the measurement of induced AC voltage a characteristic of AC electrical power supplied to the load selected from a group consisting of:
  a. root mean square ("RMS") AC electrical current flowing through the load;
  b. RMS AC voltage across the load;
  c. power factor of AC electrical power being supplied to the load; and
  d. AC electrical power dissipated in the load.

30. The method of claim 25 further comprising the step of compensating the measurement of AC electrical current produced by the AC voltage sensing circuit for characteristics of coupling between AC electrical current flowing through:
  a. the set of contacts of the relay; and
  b. the coil of the relay.

31. The method of claim 25 further comprising the step of coupling an ADC to the coil for measuring the induced AC voltage.

32. The method of claim 31 further comprising the step of coupling a capacitor in series between the coil and the ADC.

33. The method of claim 31 further comprising the step of coupling a processor to the ADC for performing an operation selected from a group consisting of:
  a. averaging the digital measurement;
  b. reducing noise present in the digital measurement;
  c. compensating for characteristics of coupling between:
    i. AC electrical current flowing through the set of contacts of the relay; and
    ii. the coil of the relay;
  d. determining a characteristic of AC electrical power supplied to the load selected from a group consisting of:
    i. RMS AC electrical current flowing through the load;
    ii. RMS AC voltage across the load;
    iii. AC electrical power dissipated in the load;
    iv. power factor of AC electrical power being supplied to the load and
    v. actual true power dissipation measured in units selected from a group consisting of watt-hours and kilowatt-hours, the actual true power dissipation being determined using the determined power factor.

34. The method of claim 31 further comprising the step of connecting a length of electrically conductive material in series with the set of contacts and juxtaposing the length of electrically conductive material with the coil for increasing coupling between the coil and AC electrical current flowing through the set of contacts and the load.

* * * * *